US010595410B2

(12) United States Patent
Hua et al.

(10) Patent No.: US 10,595,410 B2
(45) Date of Patent: Mar. 17, 2020

(54) NON-PLANAR ON-PACKAGE VIA CAPACITOR (71) Applicant: Intel Corporation, Sanata Clara, CA (US)

(72) Inventors: Fay Hua, Fremont, CA (US); Brandon M. Rawlings, Chandler, AZ (US); Georgios C. Dogiamis, Chandler, AZ (US); Telesphor Kamgaing, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 15/283,352

(22) Filed: Oct. 1, 2016

(65) Prior Publication Data
US 2018/0098428 A1 Apr. 5, 2018

(51) Int. Cl.
H05K 1/16 (2006.01)
H01L 21/48 (2006.01)
(Continued)

(52) U.S. Cl.
CPC ............ *H05K 1/162* (2013.01); *H01L 21/486* (2013.01); *H01L 21/4857* (2013.01); *H01L 23/49822* (2013.01); *H01L 23/49838* (2013.01); *H01L 25/16* (2013.01); *H05K 1/115* (2013.01); *H05K 3/424* (2013.01); *H01L 23/49827* (2013.01); *H05K 3/0032* (2013.01); *H05K 3/0094* (2013.01); *H05K 3/389* (2013.01); *H05K 3/4007* (2013.01); *H05K 3/421* (2013.01); *H05K 3/422* (2013.01); *H05K 2201/0187* (2013.01); *H05K 2201/09509* (2013.01);
(Continued)

(58) Field of Classification Search
CPC ...... H05K 1/162; H05K 1/115; H05K 3/0032; H05K 3/422; H05K 3/424; H05K 2201/10098; H05K 2203/107; H01L 21/4857; H01L 21/486; H01L 23/49822; H01L 23/49827; H01L 23/49838; H01L 25/16
See application file for complete search history.

(56) References Cited

U.S. PATENT DOCUMENTS 4,685,197 A * 8/1987 Tigelaar .............. H01L 21/8229
216/19
7,285,490 B2 * 10/2007 Barth .................. H01L 23/5223
257/E21.579
(Continued)

FOREIGN PATENT DOCUMENTS

KR 1020090001383 1/2009

OTHER PUBLICATIONS

International Search Report and Written Opinion for PCT/US2017/049226, dated Dec. 11, 2017, 15 pages.
(Continued)

Primary Examiner — Dion Ferguson
(74) Attorney, Agent, or Firm — Schwabe, Williamson & Wyatt, P.C.

(57) ABSTRACT

Embodiments are generally directed to non-planar on-package via capacitor. An embodiment of an embedded capacitor includes a first plate that is formed in a package via; a dielectric layer that is applied on the first plate; and a second plate that is formed in a cavity in the dielectric layer, wherein the first plate and the second plate are non-planar plates.

17 Claims, 13 Drawing Sheets (51) Int. Cl.
  *H01L 23/498* (2006.01)
  *H01L 25/16* (2006.01)
  *H05K 1/11* (2006.01)
  *H05K 3/42* (2006.01)
  *H05K 3/00* (2006.01)
  *H05K 3/38* (2006.01)
  *H05K 3/40* (2006.01)

(52) U.S. Cl.
  CPC .............. *H05K 2201/09581* (2013.01); *H05K 2201/10098* (2013.01); *H05K 2201/10674* (2013.01); *H05K 2203/0723* (2013.01); *H05K 2203/107* (2013.01)

(56) References Cited

U.S. PATENT DOCUMENTS

| | | | |
|---|---|---|---|
| 7,538,375 B2* | 5/2009 | Kim | H01L 23/5223 257/303 |
| 8,022,548 B2* | 9/2011 | Oladeji | H01L 21/76838 257/758 |
| 8,710,658 B2* | 4/2014 | Aboush | H01L 23/5223 257/40 |
| 8,809,149 B2* | 8/2014 | Lee | H01L 29/66181 257/320 |
| 9,178,009 B2* | 11/2015 | Lee | H01L 27/10805 |
| 2005/0006688 A1* | 1/2005 | Solo De Zaldivar | H01L 23/5222 257/306 |
| 2007/0114634 A1* | 5/2007 | Lin | H01L 23/50 257/528 |
| 2007/0231998 A1 | 10/2007 | Chen et al. | |
| 2010/0041203 A1* | 2/2010 | Collins | H01L 23/481 438/386 |
| 2012/0028458 A1 | 2/2012 | Cabral, Jr. et al. | |
| 2012/0322394 A1 | 12/2012 | Chien | |
| 2015/0364534 A1 | 12/2015 | Nowak et al. | |

OTHER PUBLICATIONS

International Preliminary Report on Patentability for PCT/US2017/049226, dated Apr. 11, 2019, 10 pages.

* cited by examiner

Non-Planar Capacitor

Parallel Plate Capacitor
150

NON-PLANAR ON-PACKAGE VIA CAPACITOR

TECHNICAL FIELD

Embodiments described herein generally relate to the field of electronic devices and, more particularly, a non-planar on-package via capacitor.

BACKGROUND

Modern wireless communication systems utilize several passive networks for matching and filtering. At radio frequencies (RF), the most critical passive components are inductors and capacitors. The filtering and matching circuits, which include transformers, baluns, filters, diplexers among others, can be fabricated as an integrated passive device (IPD) using silicon, glass, LTCC (Low Temperature Co-fired Ceramic), or other semiconducting substrate and then attached/assembled on the package. Alternatively, such circuits can be fabricated as part of the organic package or PCB (Printed Circuit Board) substrate. Direct fabrication of the passives on the package removes the need for assembly, and can allow package height reduction.

Metal-insulator-metal (MIM) capacitors on package have been demonstrated using high-k material sandwiched between planar metal layers. In this arrangement, the high-k dielectric layer is thinner than the other (build-up) dielectric layers of the package.

However, the density of on-package MIM capacitors have been limited by (1) the electrode surface area that is available, (2) the need for signal escape using vias and associated large via pads.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to a non-planar on-package via capacitor.

As used herein, the following apply:

"Capacitance density" refers to capacitance per lateral area unit.

In some embodiments, an apparatus, system, or process provides for a non-planar on package via capacitor. In some embodiments, the non-planar on package via capacitor is fabricated in a package using a SAM (Self-Assembled Monolayers) assisted Laser direct structuring process. The implementation of a non-planar on package via capacitor enables a significant increase in capacitance by increasing the plate area and reducing plate distance without increasing the area required for capacitors.

While most RF applications utilize capacitors in the order of fF (femtofarads, $\times 10^{-15}$) to a few pF (picofarads, $\times 10^{-12}$), enabling high density (for example 10-30 $pF/mm^2$) capacitance can assist significantly with the circuit size reduction, and further help with the reduction of parasitic inductance in a circuit. Parasitic inductance increases the capacitance self-resonance frequency, and therefore limits applicability for broadband (with respect to frequency bandwidth) circuit implementation.

Figure 1A:
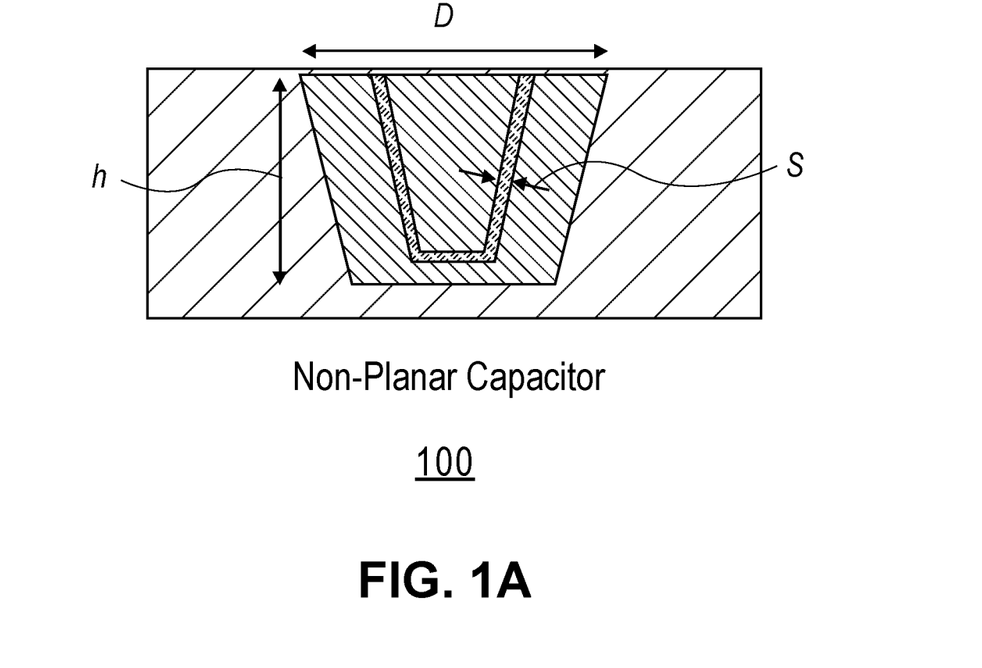
FIGS. 1A and 1B illustrate capacitor architecture according to an embodiment.
Figure 1B:
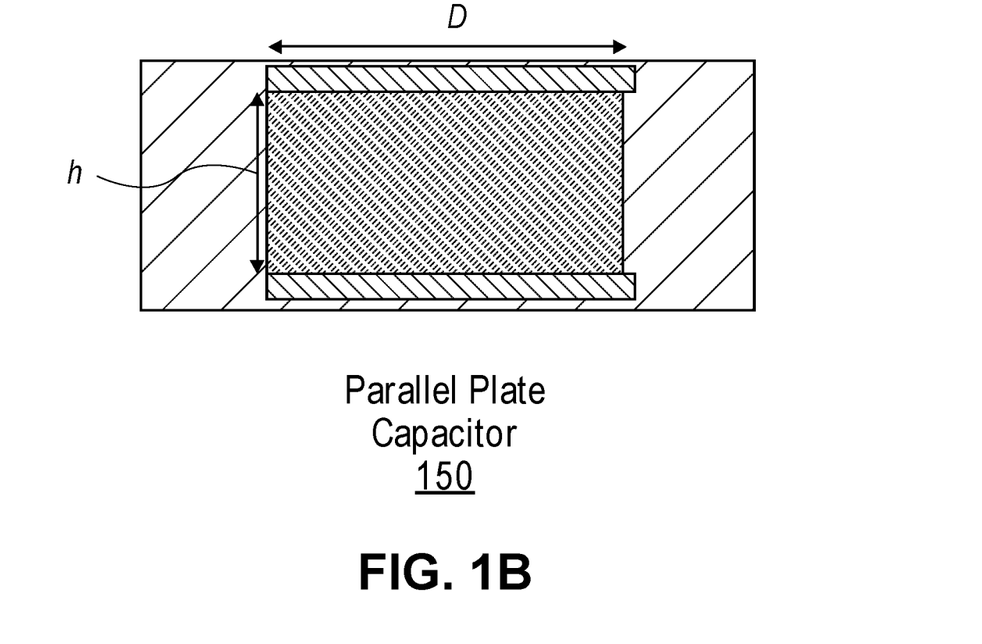

FIGS. 1A and 1B illustrate capacitor architecture according to an embodiment. In some embodiments, an on package capacitor is generated in a non-planar architecture, thus allow an increase in area plate area and capacitance while not increasing the X-Y space required for the on package capacitor. As illustrated in FIG. 1A, in an embodiment a capacitor 100 is a non-planar shaped on package capacitor, the non-planar capacitor 100 including a height h, diameter D, and spacing distance S for the capacitor, with a dielectric material having dielectric constant k being between the plates, While the particular capacitor 100 in FIG. 1A is illustrated as a capacitor with a conical or cylindrical shape, embodiments are not limited to these shapes, but rather also include any other non-planar shape that can be fabricated in the via, which may also include a pyramidal shape, a polyhedral shape, or irregular shape.

In comparison, FIG. 1B illustrates a conventional parallel plate on package capacitor, the capacitor also including a diameter D and height h. However, the non-planar capacitor includes a significantly larger plate area and significantly smaller spacing distance because of the non-planar construction of the device.

In some embodiments, a metallization process allows for fabrication of non-planar capacitors, including capacitors of conical, cylindrical, or other nonplanar shapes. For these geometries, the capacitance density can be greatly increased by making the dielectric separation layer much smaller than the layer thickness, an arrangement that is not available to parallel plate capacitors where the separation is dictated by other package design considerations. The capacitance per unit area is inversely proportional to the separation distance S, as provided in Equation 1:

$$C/A = \frac{k\epsilon_0}{S} \qquad [1]$$

Because of the inverse proportion of capacitance to separation distance, the decrease in separation distance will scale the capacitance density.

Further, an embodiment of an on-package conical or cylindrical capacitors will have a capacitance density that is higher than parallel plate on-package capacitors density by a factor roughly proportional to the aspect ratio. For conical or cylindrical shaped capacitors, assuming the separation distance is much smaller than both the height and diameter, the capacitance per lateral area unit is increased by a factor F equal to:

$$F = \frac{\pi D^2}{\sin\theta}\left(\frac{h}{D}\right)\left(1 - \frac{\frac{h}{D}}{\tan\theta}\right) \quad [2]$$

In a particular example, assuming a separation distance s=200 nm for a conical capacitor, a dielectric constant of 3.0, a capacitor height of h=15 μm, a parallel plate capacitor separation distance of h=15 μm, a sidewall angle of θ=80°, and a capacitor diameter D of 30 μm, the resultant capacitance per unit lateral area is $7.7 \times 10^{-4}$ F/mm$^2$ for the conical or cylindrical capacitor and $1.8 \times 10^{-6}$ F/mm$^2$ for the parallel-plate equivalent.

A non-planar via capacitor according to an embodiment may provide the following:

(a) The capacitance of the non-planar device may have more than twice the capacitance density compared to traditional planar MIM capacitors on package.

(b) In an embodiment in which the vertical capacitance structure is combined with high-k dielectric materials, the capacitance density may be high enough to enable on-package capacitances for certain power delivery applications. For example, decoupling capacitors for many electronic circuits may vary between 100 pF and 10 nF.

(c) A non-planar package integrated capacitor may be implemented in many RF and digital circuits, or in power delivery in certain implementations, without need for significant additional assembly in comparison with discrete passives.

Figure 2:
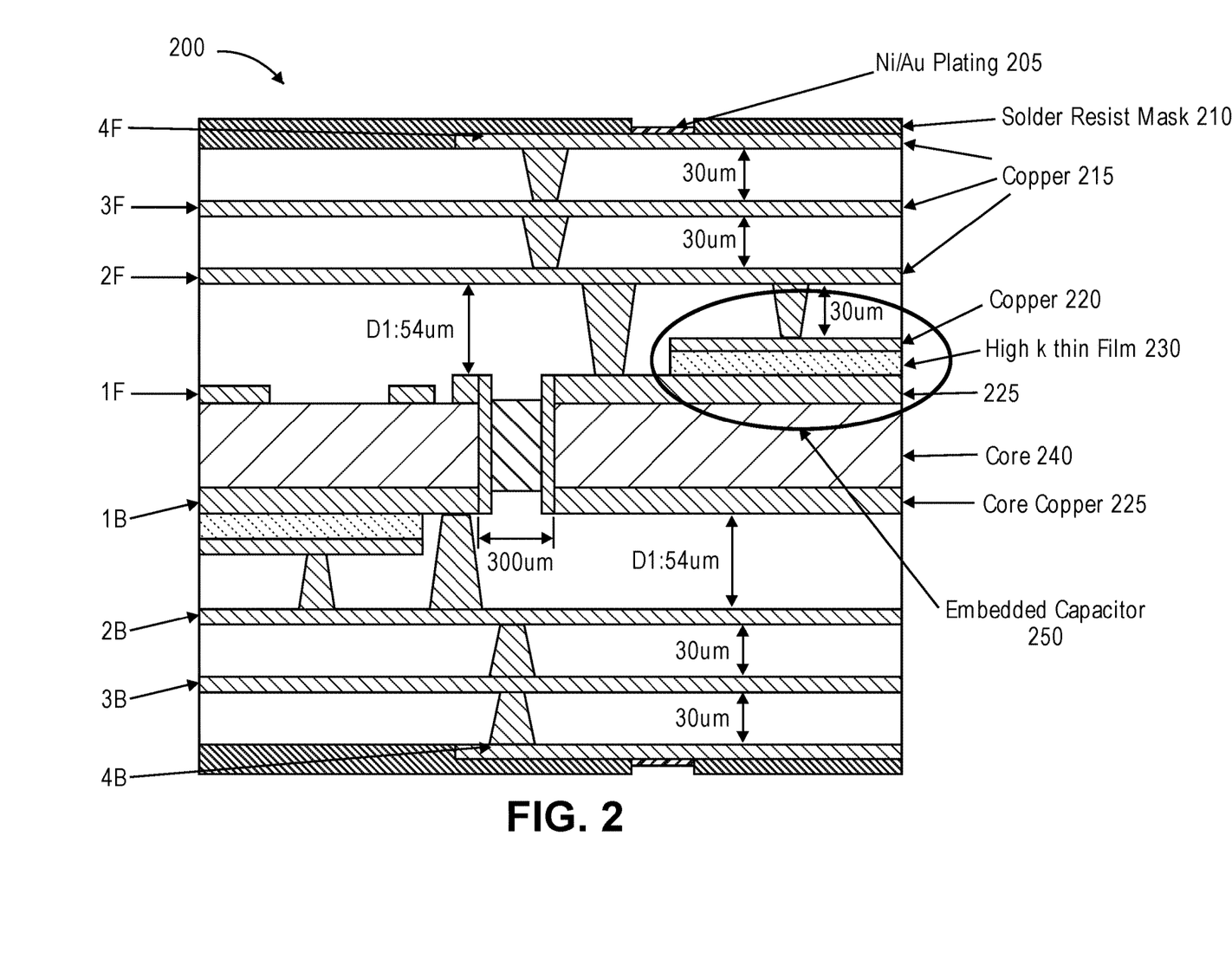
FIG. 2 is an illustration of a package including an on package capacitor.

FIG. 2 is an illustration of a package including an on package capacitor. As illustrated in FIG. 2, a particular package 200 includes multiple layers, illustrated as, from a core 240, layers 1F through 4F (up from the core) and 1B through 4B (down from the core). Among other elements, the package may include Ni/Au (Nickel/gold) plating at 4F, and copper plating at 4F, 3F, and 2F. The package includes an embedded (integrated) capacitor 250 including first copper plate 220, second copper plate 225 at 1F, and between the plates a high k thin film dielectric 230, with a via providing connection to 2F. As shown, the embedded capacitor utilizes conventional parallel plates, thus providing limited capacitance.

In some embodiments, rather than utilizing parallel plates as illustrated in FIG. 2, the embedded capacitor may instead include a non-planer capacitor, such as a conical or cylindrical capacitor 100 as illustrated in FIG. 1A.

In some embodiments, in order to provide enhanced capacitance in a package without requiring additional package space, a process is provided to generate a conical, cylindrical, or other non-planar shape, including the provision of effective plating of the surface of the non-planar shape.

Figure 3A:
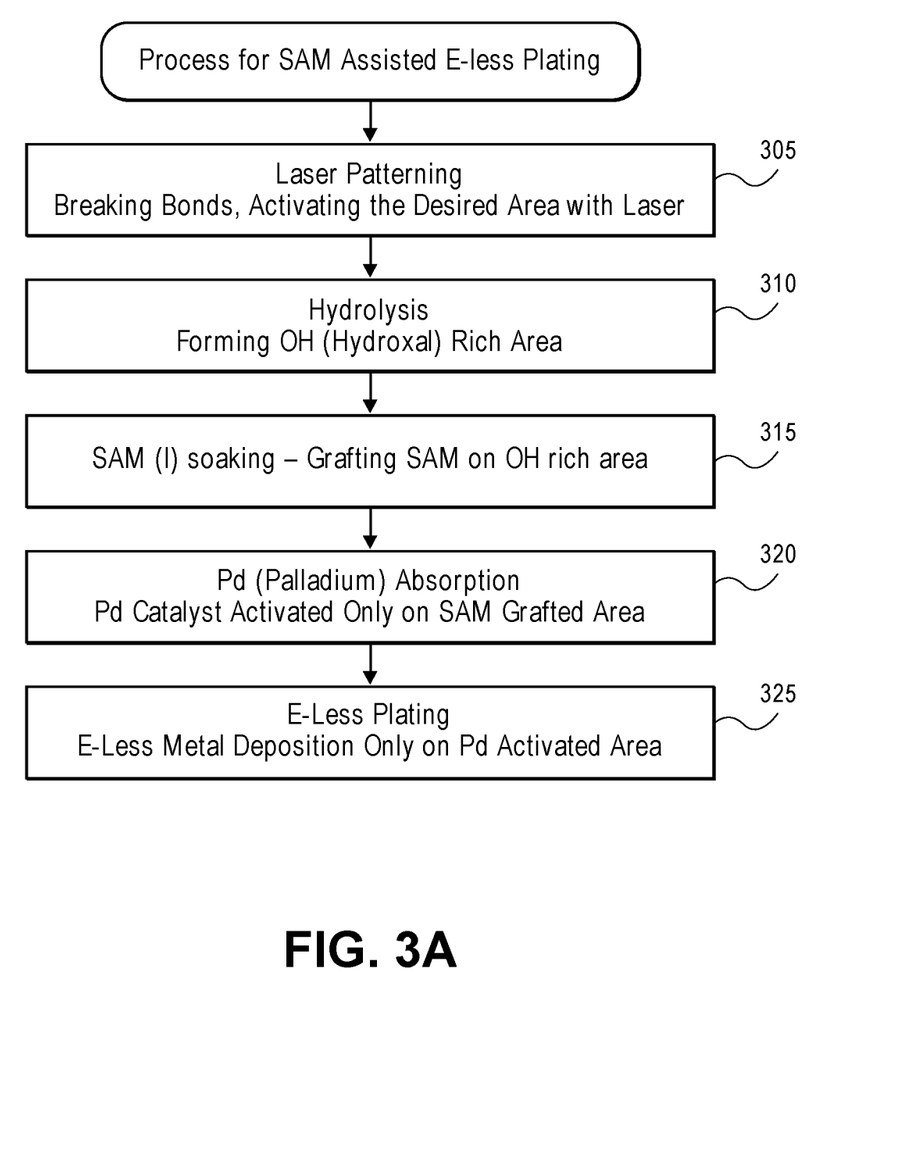
FIG. 3A illustrates a process for SAM assisted e-less plating for generation of an on package capacitor according to an embodiment.

FIG. 3A illustrates a process for SAM assisted e-less plating for generation of an on package capacitor according to an embodiment. In some embodiments, a non-planar on package capacitor is generated utilizing SAM (Self Aligned Monolayer) assisted e-less (electro-less) plating, wherein the plating process includes the following:

305: Laser patterning—In order to break molecular bonds within a material, activating the desired area with a laser.

310: Hydrolysis—Forming an —OH (hydroxyl) rich area.

315: SAM (1) soaking—Grafting SAM onto the —OH rich area.

320: Pd (Palladium) absorption—A palladium catalyst is activated only on the SAM grafted area.

325: E-less plating—Electro-less metal deposition only on the Pd activated area.

Figure 3B:
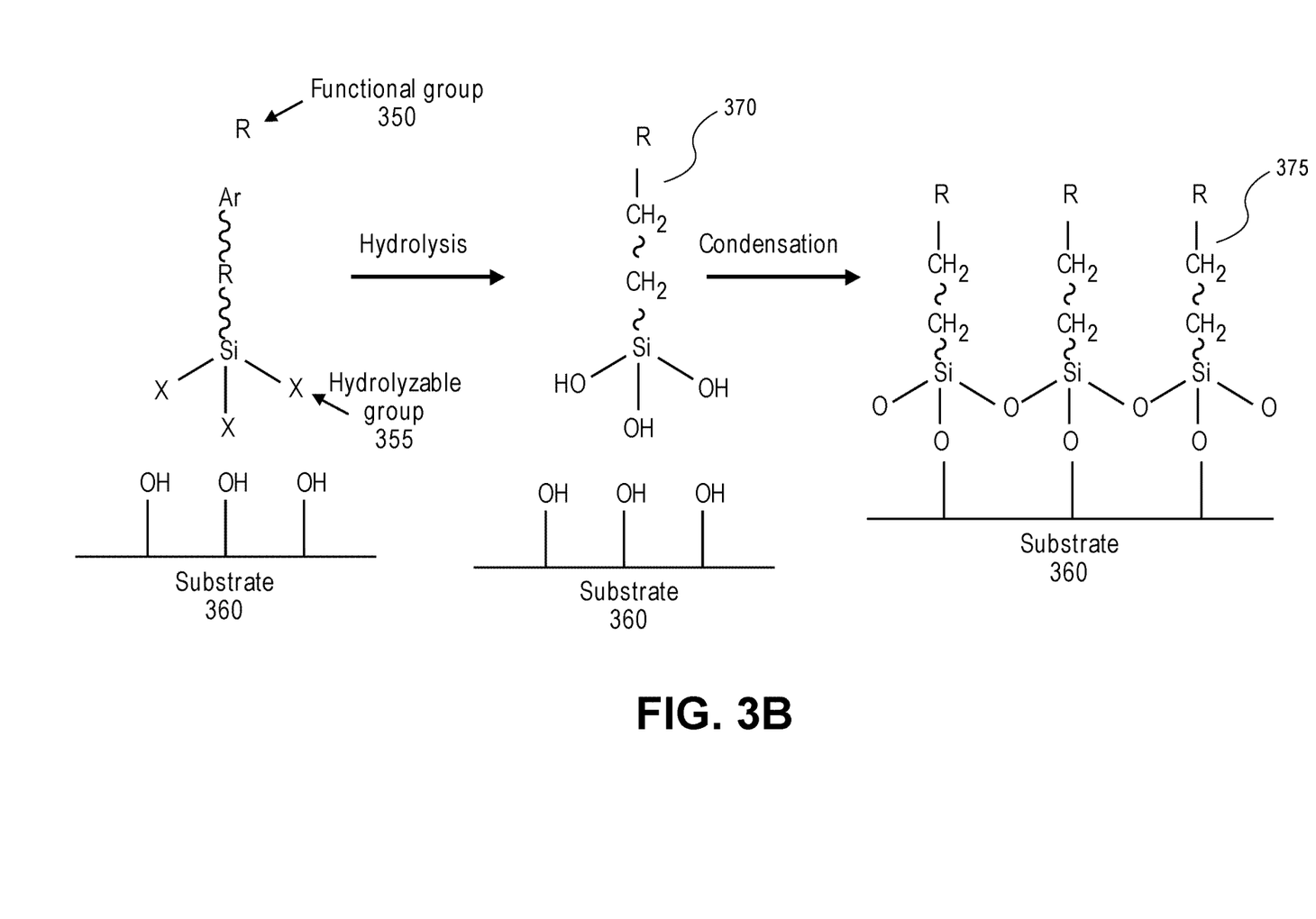
FIG. 3B illustrates siloxane SAM grafting on activated substrates for generation of an on package capacitor according to an embodiment.

FIG. 3B illustrates siloxane SAM grafting on activated substrates for generation of an on package capacitor according to an embodiment. As illustrated in FIG. 3B, a process for grafting a functional group R 350 onto an activated substrate 360 includes performance of hydrolysis on a hydrolysable group 355 to form a combined molecule 370. The grafting process further includes condensation, resulting in the grating of the condensed molecule 375 onto the substrate 360.

Figure 4A:
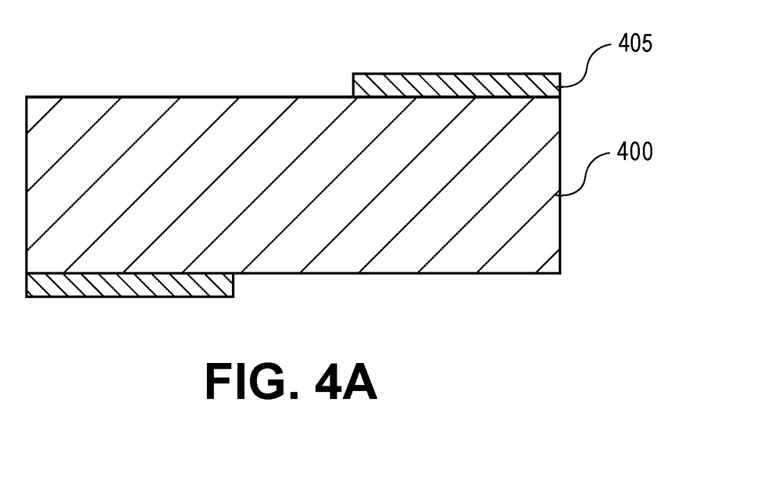
FIGS. 4A through 4L illustrate the fabrication of an embedded non-planar capacitor according to an embodiment.

FIGS. 4A through 4L illustrate the fabrication of an embedded non-planar capacitor according to an embodiment. In some embodiments, the fabrication of an embedded non-planar capacitor includes the following:

FIG. 4A: A substrate core 400 is clad with copper 405.

Figure 4B:
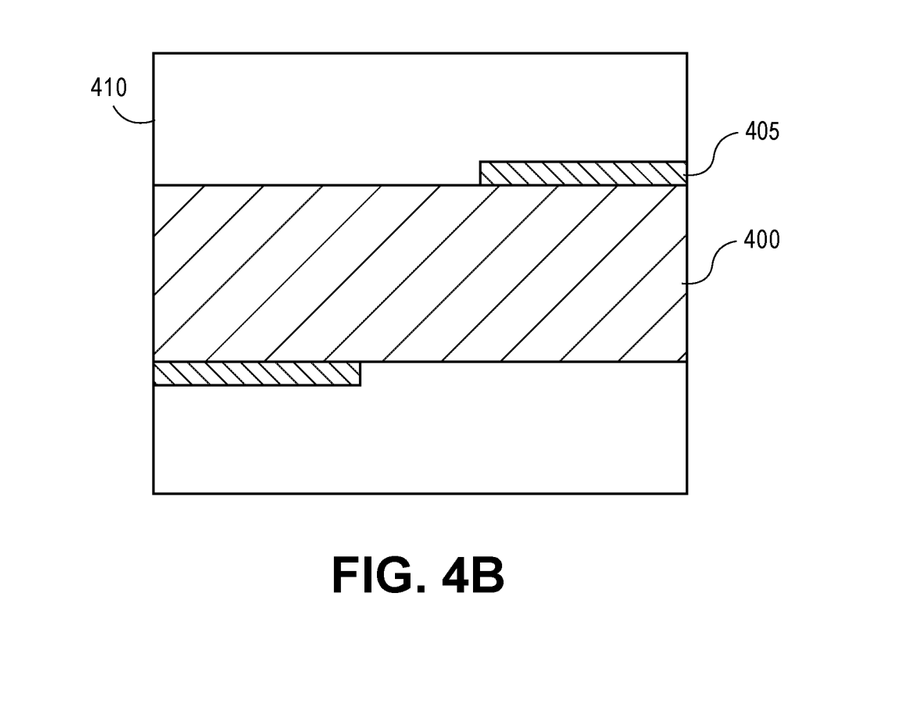

FIG. 4B: Laminate build up material 410 is applied, wherein the laminate material may include build-up layer dielectric film.

Figure 4C:
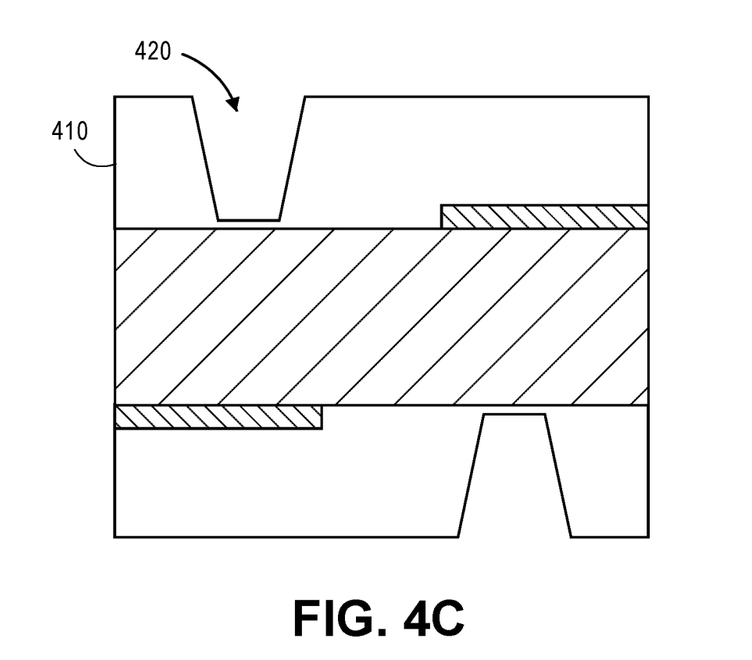

FIG. 4C: A laser is applied to form vias 420.

Figure 4D:
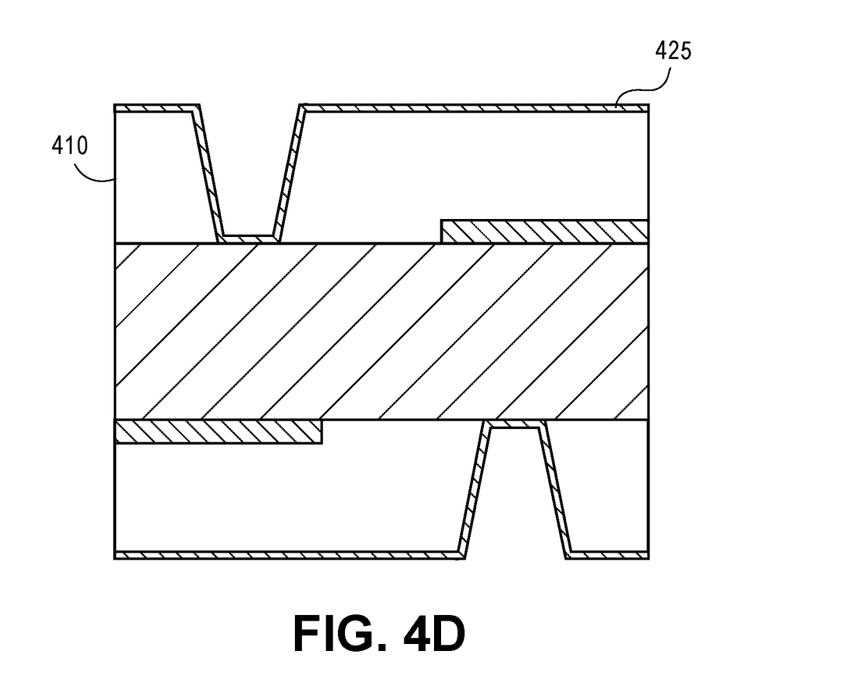

FIG. 4D: Electro-less plating to provide for forming of seed layer 425 over the surface of the laminate material 410. In some embodiments, the electro-less plating is SAM assisted electro-less plating.

Figure 4E:
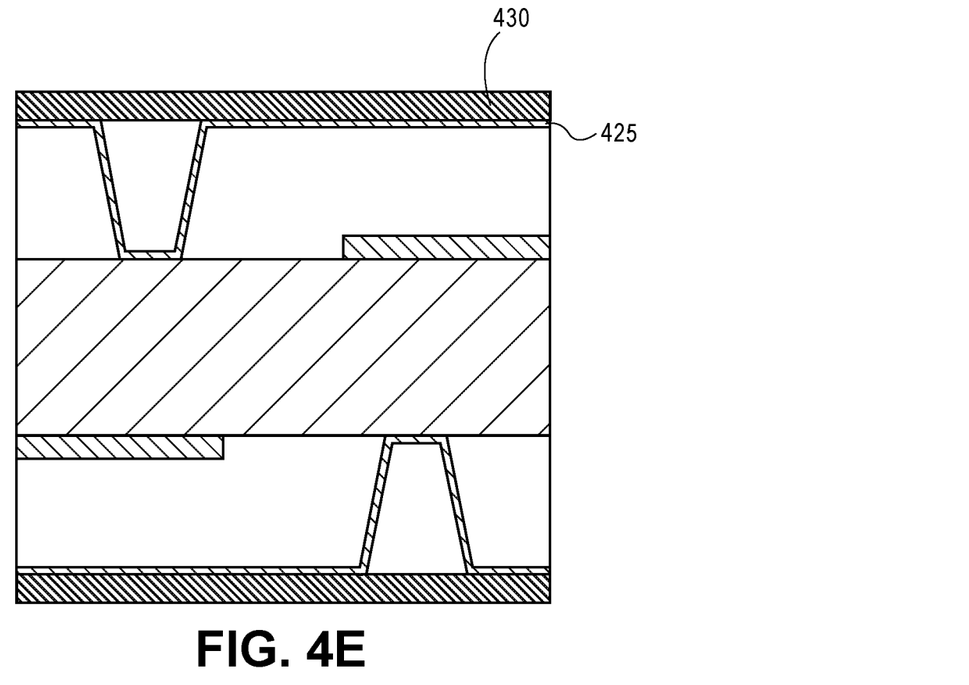

FIG. 4E: Photo imaging resist 430 is laminated on the seed layer 425.

Figure 4F:
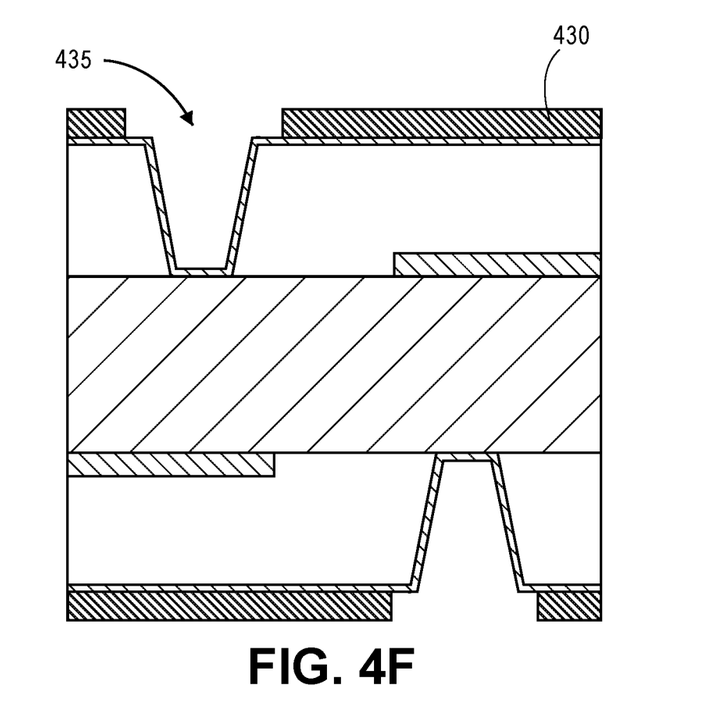

FIG. 4F: Photo imaging patterning of the vias 435.

Figure 4G:
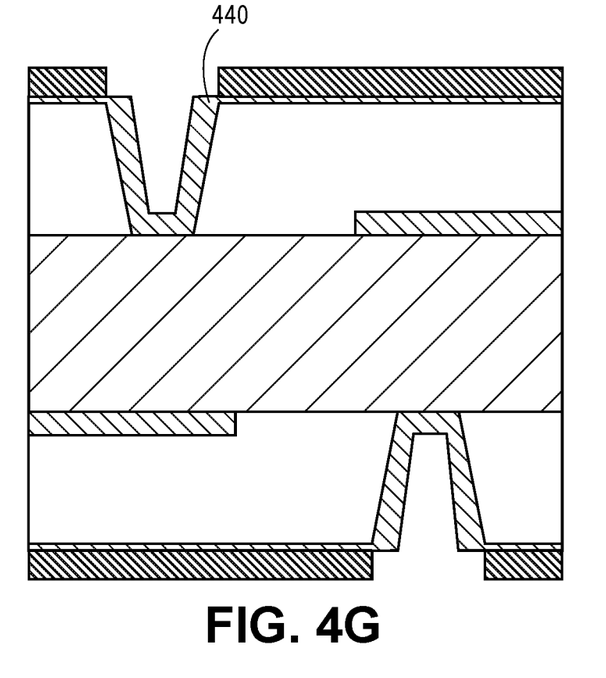

FIG. 4G: Electrolytic copper plating 440 of the vias.

Figure 4H:
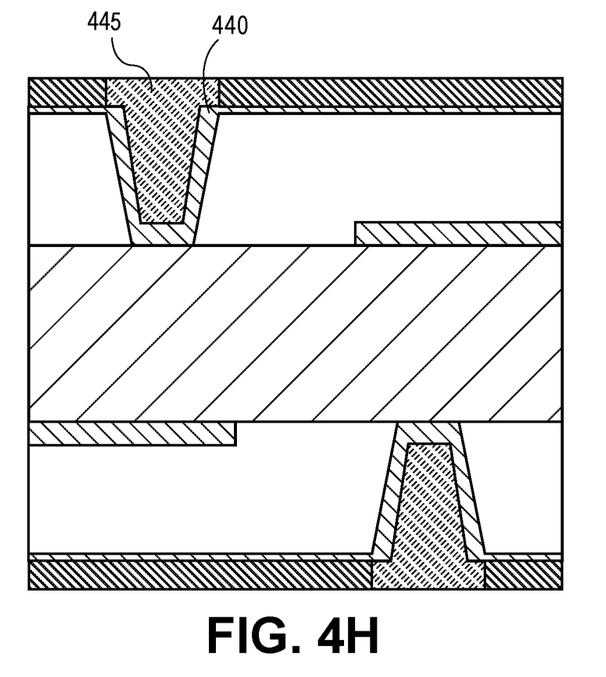

FIG. 4H: Polymer 445 is applied over the copper plating 440 of the vias to provide a capacitor dielectric.

Figure 4I:
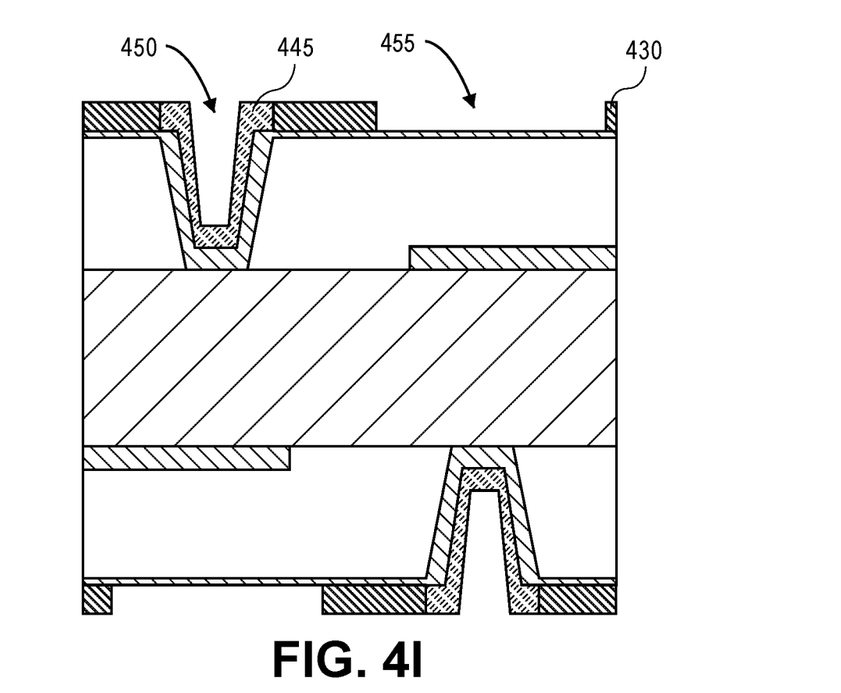

FIG. 4I: Laser drilling of the polymer dielectric 445 to form a cavity 450 together with forming of trace location 455 in the photo imaging resist 430.

Figure 4J:
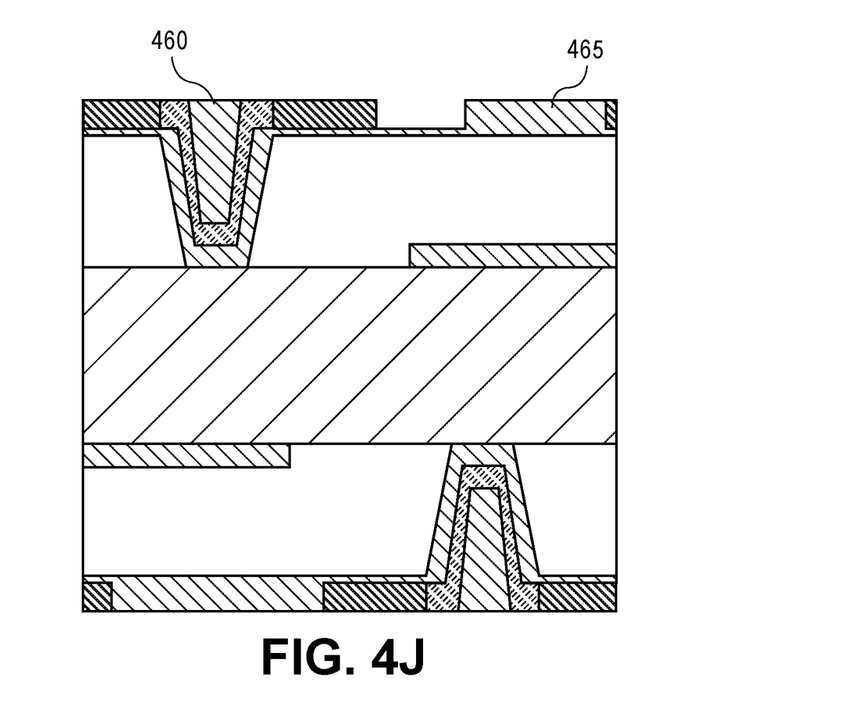

FIG. 4J: SAM assisted electro-less plating, such as illustrated in FIG. 3A, of laser drilled area for copper seeding, and electrolytic copper plating to fill the via cavities 460 and trace 465.

Figure 4K:
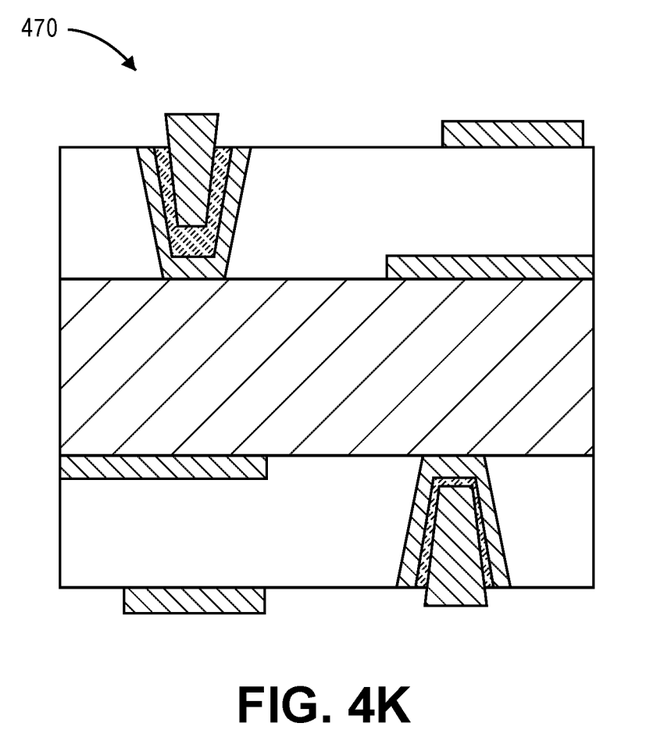

FIG. 4K: Resist stripping and seed removal, completing fabrication of the non-planar embedded capacitor 470, wherein the capacitor in the embodiment is formed as a conical, cylindrical, pyramidal, polyhedral, or irregular shaped non-planar capacitor. However, embodiments of non-planar capacitors are not limited to these shapes.

Figure 4L:
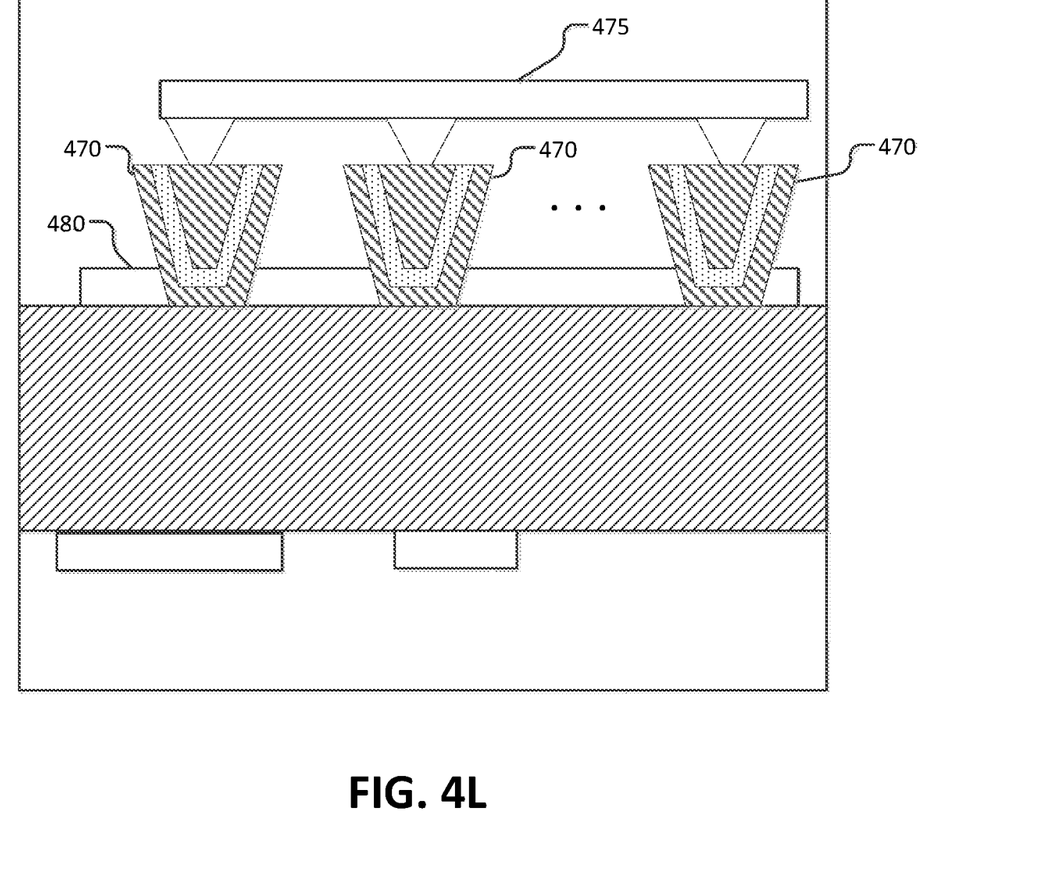

FIG. 4L: In some embodiments, a set of multiple non-planar capacitors 470 may be formed. In some embodiments, the multiple non-planar capacitors may be interconnected, as shown by an interconnection 475 of a first plate of each of the non-planar capacitors 470 and an interconnection 480 of a second plate of each of the non-planar capacitors 470. In some embodiments, the interconnection of the non-planar capacitors includes one of a series interconnection or a parallel interconnection of the non-planar capacitors.

Figure 5:
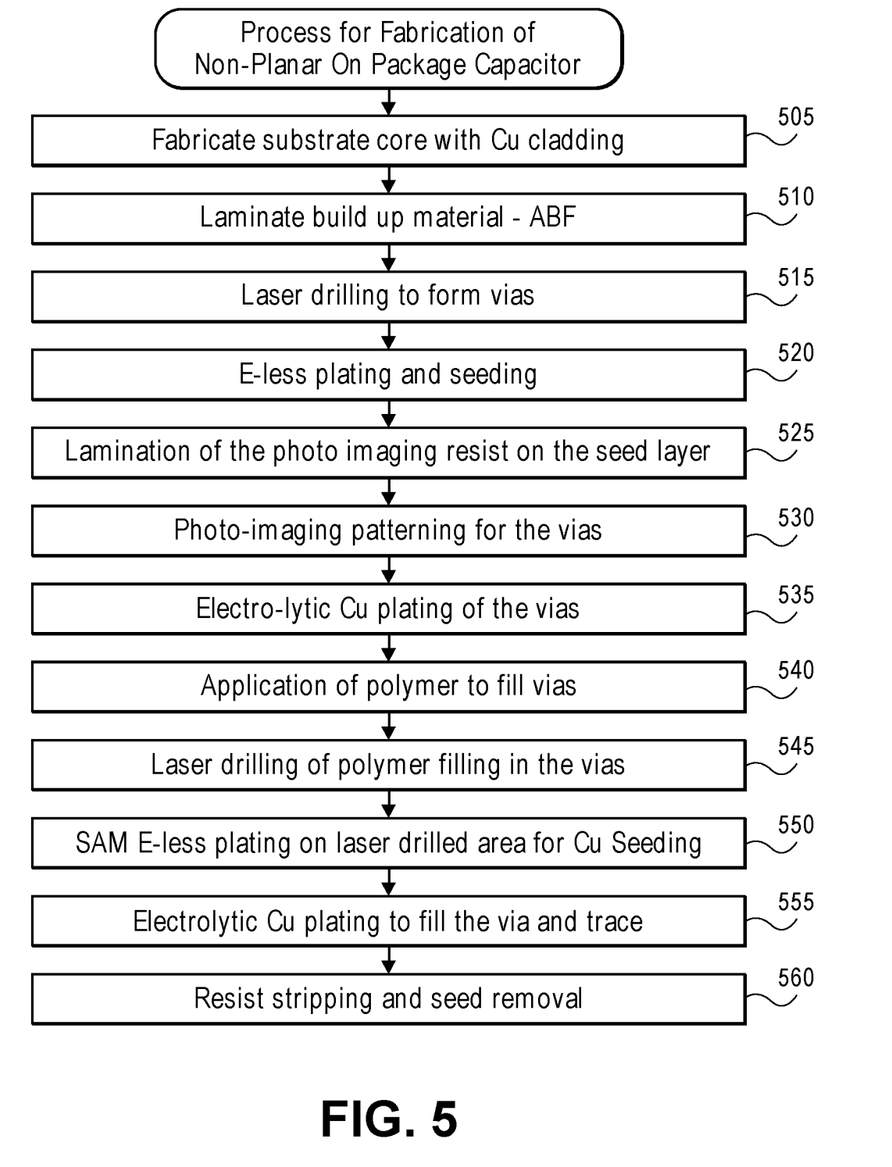
FIG. 5 is a flowchart to illustrate a process for fabrication of a non-planar on package capacitor according to an embodiment.

FIG. 5 is a flowchart to illustrate a process for fabrication of a non-planar on package capacitor according to an embodiment. In some embodiments, a process for fabricating a non-planar capacitor includes:

505: Fabricate substrate core with copper cladding.

510: Laminate build up material on the substrate core, wherein the laminate material may include build-up dielectric film.

515: Laser drilling of the laminate material to form vias.

520: Perform electro-less plating and forming of seed layer over the surface of the laminate material.

525: Lamination of photo imaging resist on the seed layer.

530: Perform photo imaging patterning of the vias.

535: Perform electrolytic copper plating of the vias.

540: Application of polymer to fill the vias for a capacitor dielectric.

545: Laser drilling of the polymer filling in the vias to form cavities.

550: Perform SAM assisted electro-less plating of laser drilled area for copper seeding.

555: Perform electrolytic copper plating to fill the via cavities.

560: Resist stripping and seed removal to complete fabrication of the non-planar embedded capacitor.

Figure 6:
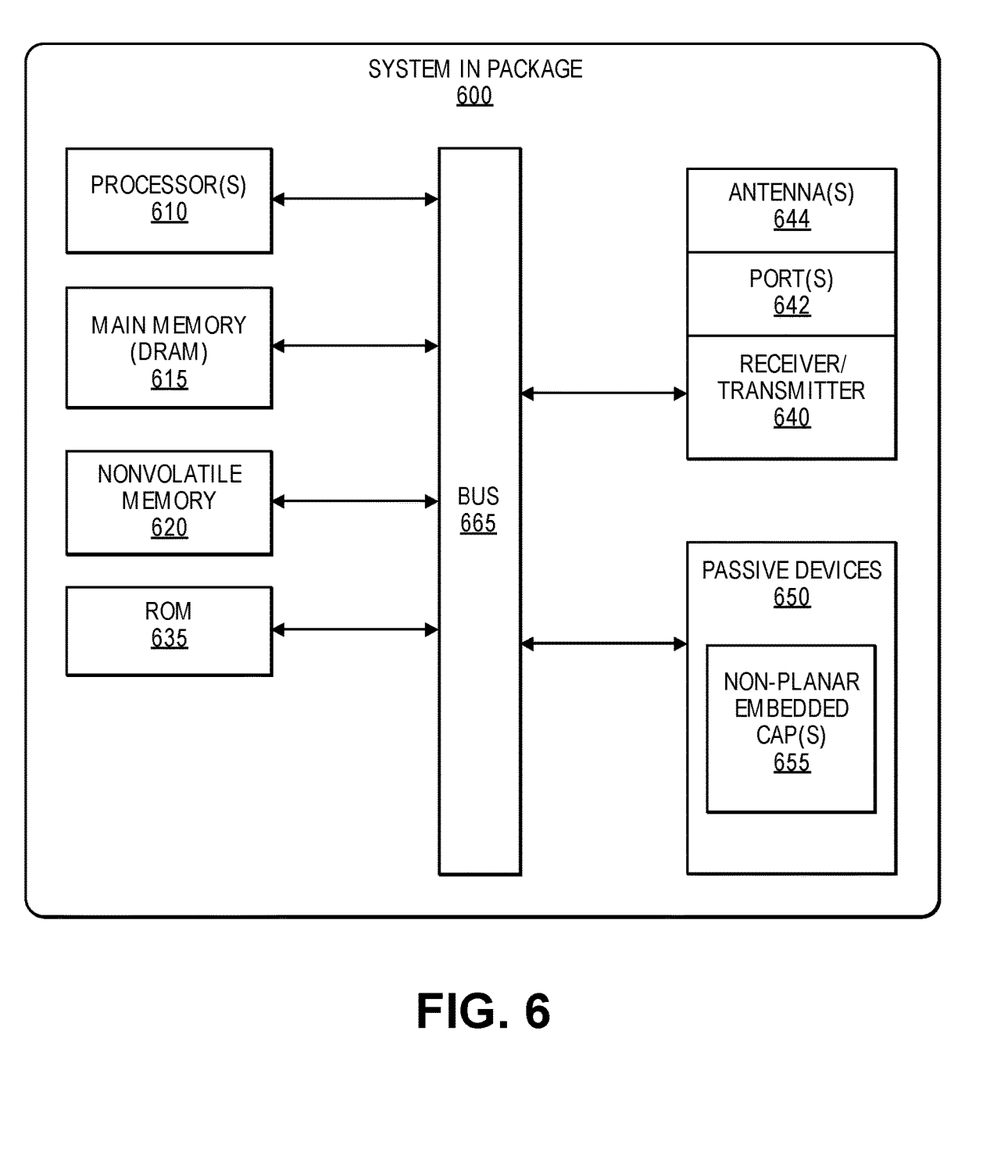
FIG. 6 is an illustration of a system including one or more embedded non-planar capacitors according to an embodiment.

FIG. 6 is an illustration of a system including one or more embedded non-planar capacitors according to an embodiment. In this illustration, certain standard and well-known components that are not germane to the present description are not shown.

In some embodiments, a system in package (SiP) or other system 600 includes one or more passive devices 650, wherein the passive devices 650 include one or more non-planar embedded capacitors 655, wherein the capacitors 655 may include capacitors fabricated in a package as illustrated in FIGS. 4A through 4L, or in a process as illustrated in FIG. 5. In some embodiments, the capacitors may include conical or cylindrical capacitors such as illustrated in FIG. 1A.

In some embodiments, the system 600 further includes a processing means such as one or more processors 610 coupled to one or more buses or interconnects, shown in general as bus 665. The processors 610 may comprise one or more physical processors and one or more logical processors. In some embodiments, the processors may include one or more general-purpose processors or special-processor processors.

The bus 665 is a communication means for transmission of data. The bus 665 is illustrated as a single bus for simplicity, but may represent multiple different interconnects or buses and the component connections to such interconnects or buses may vary. The bus 665 shown in FIG. 6 is an abstraction that represents any one or more separate physical buses, point-to-point connections, or both connected by appropriate bridges, adapters, or controllers.

In some embodiments, the system 600 further comprises a random access memory (RAM) or other dynamic storage device or element as a main memory 615 for storing information and instructions to be executed by the processors 610. Main memory 615 may include, but is not limited to, dynamic random access memory (DRAM).

The system 600 also may comprise a non-volatile memory 620; and a read only memory (ROM) 635 or other static storage device for storing static information and instructions for the processors 610.

In some embodiments, the system 600 includes one or more transmitters or receivers 640 coupled to the bus 665. In some embodiments, the system 600 may include one or more antennae 644, such as dipole or monopole antennae, for the transmission and reception of data via wireless communication using a wireless transmitter, receiver, or both, and one or more ports 642 for the transmission and reception of data via wired communications. Wireless communication includes, but is not limited to, Wi-Fi, Bluetooth™, near field communication, and other wireless communication standards.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an embedded capacitor includes a first plate formed in a package via; a dielectric material layer applied on the first plate; and a second plate formed in a cavity in the dielectric layer, wherein the first plate and the second plate are non-planar plates.

In some embodiments, the first plate and the second plate are conical, cylindrical, pyramidal, polyhedral, or irregular in shape.

In some embodiments, the first plate is a plate formed by electro-less plating to form a seed layer and electrolytic plating on the seed layer.

In some embodiments, the electro-less plating of the first plate includes SAM (Self-Assembled Monolayer) assisted electro-less plating.

In some embodiments, the cavity in the dielectric layer is a laser drilled cavity.

In some embodiments, the second plate is a plate formed by electro-less plating of the cavity and electrolytic plating to fill the cavity.

In some embodiments, the electro-less plating of the cavity includes SAM (Self-Assembled Monolayer) assisted electro-less plating.

In some embodiments, the electro-less plating includes laser patterning of the dielectric material layer.

In some embodiments, a method to form a non-planar via capacitor includes applying laminate build up on a package core; forming a first via with a laser; applying a first copper plating to form a first plate within the first via; filling the first via with a dielectric material; laser drilling of the dielectric material to form a cavity; and filling the cavity with a second copper plating to form a second plate.

In some embodiments, applying the first copper plating to form the first plate includes performing electro-less plating to generate a seed layer; and performing electrolytic plating to form the first plate.

In some embodiments, the electro-less plating of the first plate includes SAM (Self-Assembled Monolayer) assisted electro-less plating.

In some embodiments, filling the cavity with the second copper plating to form the second plate includes performing electro-less plating to generate a seed layer on the dielectric material; and performing electrolytic plating to form the second plate.

In some embodiments, performing electro-less plating to generate the seed layer on the dielectric material includes performing laser patterning of the dielectric material to break molecular bonds within the dielectric material.

In some embodiments, performing electro-less plating to generate the seed layer on the dielectric material includes forming an —OH (hydroxyl) rich area on the dielectric material; and grafting a SAM (Self Aligned Monolayer) onto the —OH rich area.

In some embodiments, the SAM monolayer selectively allows adsorption of a plating-promoting catalyst to promote plating.

In some embodiments, forming the first plate and the second plate includes forming non-planar plates. In some embodiments, forming the first plate and the second plate includes forming conical, cylindrical, pyramidal, polyhedral, or irregular plates.

In some embodiments, a system in package includes one or more processors in a package for processing data; a transmitter, receiver, or both in the package for communication of data using one or more antennae; and one or more passive components embedded in the package, the one or more passive components including a first non-planar via capacitor, wherein the first non-planar via capacitor includes a first plate formed in a first via of the package, a dielectric layer applied on the first plate, and a second plate formed in a cavity in the dielectric layer, wherein the first plate and the second plate of the first non-planar via capacitor are non-planar plates.

In some embodiments, the first plate and the second plate of the first non-planar via capacitor are conical, cylindrical, pyramidal, polyhedral, or irregular in shape.

In some embodiments, the first plate of the first non-planar via capacitor is a plate formed by electro-less plating to form a seed layer and electrolytic plating on the seed layer.

In some embodiments, the electro-less plating of the first plate includes SAM (Self-Assembled Monolayer) assisted electro-less plating.

In some embodiments, the cavity in the dielectric layer is a laser drilled cavity.

In some embodiments, the second plate of the first non-planar via capacitor is a plated formed by electro-less plating of the cavity and electrolytic plating to fill the cavity.

In some embodiments, the electro-less plating of the cavity includes SAM (Self-Assembled Monolayer) assisted electro-less plating.

In some embodiments, the one or more passive components embedded in the package include a plurality of non-planar via capacitors, the plurality of non-planar via capacitors being interconnected.

In some embodiments, the interconnection of the plurality of non-planar via capacitors is one of a series interconnection or a parallel interconnection.

What is claimed is:

1. An embedded capacitor comprising:
   a first plate formed in a package via, the package via having sloped sidewalls, the first plate along and in direct contact with the sloped sidewalls, and the first plate having an upper surface;
   a dielectric material layer applied on the first plate, the dielectric material having an upper surface; and
   a second plate formed in a cavity in the dielectric layer, the second plate having an upper surface;
   wherein the first plate and the second plate are non-planar plates, and wherein the upper surface of the first plate, the upper surface of the dielectric material, and the upper surface of the second plate are co-planar with one another.

2. The embedded capacitor of claim 1, wherein the first plate and the second plate are conical, cylindrical, pyramidal, polyhedral, or irregular in shape.

3. The embedded capacitor of claim 1, wherein the first plate is a plate formed by electro-less plating to form a seed layer and electrolytic plating on the seed layer.

4. The embedded capacitor of claim 3, wherein the electro-less plating of the first plate includes SAM (Self-Assembled Monolayer) assisted electro-less plating.

5. The embedded capacitor of claim 1, wherein the cavity in the dielectric layer is a laser drilled cavity.

6. The embedded capacitor of claim 1, wherein the second plate is a plate formed by electro-less plating of the cavity and electrolytic plating to fill the cavity.

7. The embedded capacitor of claim 6, wherein the electro-less plating of the cavity includes SAM (Self-Assembled Monolayer) assisted electro-less plating.

8. The embedded capacitor of claim 7, wherein the electro-less plating includes laser patterning of the dielectric material layer.

9. A system in package comprising:
one or more processors in a package for processing data;
a transmitter, receiver, or both in the package for communication of data using one or more antennae; and
one or more passive components embedded in the package, the one or more passive components including a first non-planar via capacitor, wherein the first non-planar via capacitor includes:
a first plate formed in a first via of the package, the first via of the package having sloped sidewalls, the first plate along and in direct contact with the sloped sidewalls, and the first plate having an upper surface;
a dielectric layer applied on the first plate, the dielectric material having an upper surface; and
a second plate formed in a cavity in the dielectric layer, the second plate having an upper surface;
wherein the first plate and the second plate of the first non-planar via capacitor are non-planar plates, and wherein the upper surface of the first plate, the upper surface of the dielectric material, and the upper surface of the second plate are co-planar with one another.

10. The system of claim 9, wherein the first plate and the second plate of the first non-planar via capacitor are conical, cylindrical, pyramidal, polyhedral, or irregular in shape.

11. The system of claim 9, wherein the first plate of the first non-planar via capacitor is a plate formed by electro-less plating to form a seed layer and electrolytic plating on the seed layer.

12. The system of claim 11, wherein the electro-less plating of the first plate includes SAM (Self-Assembled Monolayer) assisted electro-less plating.

13. The system of claim 9, wherein the cavity in the dielectric layer is a laser drilled cavity.

14. The system of claim 9, wherein the second plate of the first non-planar via capacitor is a plated formed by electro-less plating of the cavity and electrolytic plating to fill the cavity.

15. The system of claim 10, wherein the electro-less plating of the cavity includes SAM (Self-Assembled Monolayer) assisted electro-less plating.

16. The system of claim 9, wherein the one or more passive components embedded in the package include a plurality of non-planar via capacitors, the plurality of non-planar via capacitors being interconnected.

17. The system of claim 16, wherein the interconnection of the plurality of non-planar via capacitors is one of a series interconnection or a parallel interconnection.

* * * * *